United States Patent
Erickson et al.

(10) Patent No.: US 10,236,887 B2
(45) Date of Patent: *Mar. 19, 2019

(54) GENERATING A UNIQUE DIE IDENTIFIER FOR AN ELECTRONIC CHIP

(71) Applicant: International Business Machines Corporation, Armonk, NY (US)

(72) Inventors: Karl R. Erickson, Rochester, MN (US); Phil C. Paone, Rochester, MN (US); David P. Paulsen, Inver Grove Heights, MN (US); John E. Sheets, II, Zumbrota, MN (US); Gregory J. Uhlmann, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 10 days.

This patent is subject to a terminal disclaimer.

(21) Appl. No.: 15/808,061

(22) Filed: Nov. 9, 2017

(65) Prior Publication Data

US 2018/0149696 A1    May 31, 2018

Related U.S. Application Data

(63) Continuation of application No. 15/364,714, filed on Nov. 30, 2016, now Pat. No. 9,864,006.

(51) Int. Cl.
*G01R 31/3177* (2006.01)
*H03K 19/177* (2006.01)

(52) U.S. Cl.
CPC . *H03K 19/17744* (2013.01); *H03K 19/17792* (2013.01)

(58) Field of Classification Search
None
See application file for complete search history.

(56) References Cited

U.S. PATENT DOCUMENTS

| | | |
|---|---|---|
| 6,161,213 A | 12/2000 | Lofstrom |
| 7,210,634 B2 | 5/2007 | Sapiro |
| 7,291,507 B2 | 11/2007 | Bidermann et al. |

(Continued)

OTHER PUBLICATIONS

Jae W. Lee et al., *A Technique to Build a Secret Key in Integrated Circuits for Identification and Authentication Applications*, In Proceedings of the IEEE VLSIO Circuits Symposium, Digest of Technical Papers, <http://http://webcache.googleusercontent.com/search?q=cache:EVIzf67UOQwJ:liberty.princeton.edu/Publications/vlsi04_puf.pdf+&cd=1&hl=en&ct=clnk&gl=us > (online), dated 2004 (month unknown), 4 pages.

(Continued)

*Primary Examiner* — Crystal L Hammond

(74) *Attorney, Agent, or Firm* — Joseph D. Downing; Nathan M. Rau; Kennedy Lenart Spraggins LLP

(57) ABSTRACT

Generating a unique die identifier for an electronic chip including placing the electronic chip in an identifier generation state, wherein the electronic chip comprises a set of test circuits, wherein each of the set of test circuits is attached to a corresponding component on the electronic chip; obtaining an ordered list of race pairs of the set of test circuits; for each race pair in the ordered list of race pairs of the set of test circuits: selecting the race pair of test circuits; executing a race between the selected race pair; and adding an element to the unique die identifier based on an outcome of the executed race; and returning the electronic chip to an operational state.

20 Claims, 6 Drawing Sheets

(56) References Cited

U.S. PATENT DOCUMENTS

| | | | |
|---|---|---|---|
| 7,665,049 B2 | 2/2010 | Muranaka | |
| 8,291,357 B2 | 10/2012 | Bueti et al. | |
| 9,729,334 B2* | 8/2017 | Choi | H01H 85/0241 |
| 9,762,241 B1* | 9/2017 | Augustine | H03K 19/00315 |
| 2005/0082664 A1 | 4/2005 | Funaba et al. | |
| 2007/0156845 A1 | 7/2007 | Devanneaux et al. | |
| 2011/0317829 A1* | 12/2011 | Ficke | H04L 9/3278 |
| | | | 380/46 |
| 2017/0242660 A1* | 8/2017 | Katoh | G06F 7/588 |

OTHER PUBLICATIONS

Ying Su et al., *A Digital 1.6 pJ/bit Chip Identification Circuit Using Process Variations*, IEEE Journal of Solid-State Circuits, vol. 43, No. 1, dated Jan. 1, 2008, 9 pages.

Yunju Choi et al., *Robust Random Chip ID Generation with Wide-Aperture Clocked Comparators and Maximum Likelihood Detection*, <http://webcache.googleusercontent.com/search?q=cache:-SCeDM8N5K4J:ciss.re.kr/BBS/Include/BBS_Download.php%3Ffile%3Dimage/conference/up6vINbl%26_file%3Dchipid_iscas2013.pdf%26no%3D145+&cd=1&hl=en&ct=clnk&gl=us> (online), IEEE International Symposium in Circuits and Systems, dated May 2013, 4 pages.

Srivatsan Chellappa et al., *SRAM-Based Unique Chip Identifier Techniques*, IEE Transactions on Very Large Integration (VLSI) Systems, vol. 24, No. 4, dated Apr. 2016, 10 pages.

Lukas Sekanina et al.,*Implementing a Unique Chip ID on a Reconfigurable Polymorphic Circuit*, ISSN 1392-124X Information Technology and Control, vol. 42, No. 1, <http://webcache.googleusercontent.com/search?q=cache:0epcwLRi8PgJ:eis.ktu.It/index.php/ITC/article/viewFile/925/2374+&cd=1&hl=en&ct=clnk&gl=us>, dated 2013 (month unknown), 8 pages.

Erickson et al., *Generating A Unique Die Identifier for an Electronic Chip*, IBM, U.S. Appl. No. 15/364,714, filed Nov. 30, 2016, 24 pages.

Appendix P; List of IBM Patents or Applications Treated as Related, Nov. 9, 2017, 2 pages.

\* cited by examiner

US 10,236,887 B2

GENERATING A UNIQUE DIE IDENTIFIER FOR AN ELECTRONIC CHIP

CROSS-REFERENCE TO RELATED APPLICATION

This application is a continuation application of and claims priority from U.S. patent application Ser. No. 15/364,714, filed on Nov. 30, 2016.

BACKGROUND

Field of the Invention

The field of the invention is data processing, or, more specifically, methods, apparatus, and products for generating a unique die identifier for an electronic chip.

Description of Related Art

The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

SUMMARY

Methods, systems, and apparatus for generating a unique die identifier for an electronic chip are disclosed in this specification. Generating a unique die identifier for an electronic chip includes placing the electronic chip in an identifier generation state, wherein the electronic chip comprises a set of test circuits, wherein each of the set of test circuits is attached to a corresponding component on the electronic chip; obtaining an ordered list of race pairs of the set of test circuits; for each race pair in the ordered list of race pairs of the set of test circuits: selecting the race pair of test circuits; executing a race between the selected race pair; and adding an element to the unique die identifier based on an outcome of the executed race; and returning the electronic chip to an operational state.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION

Figure 1:
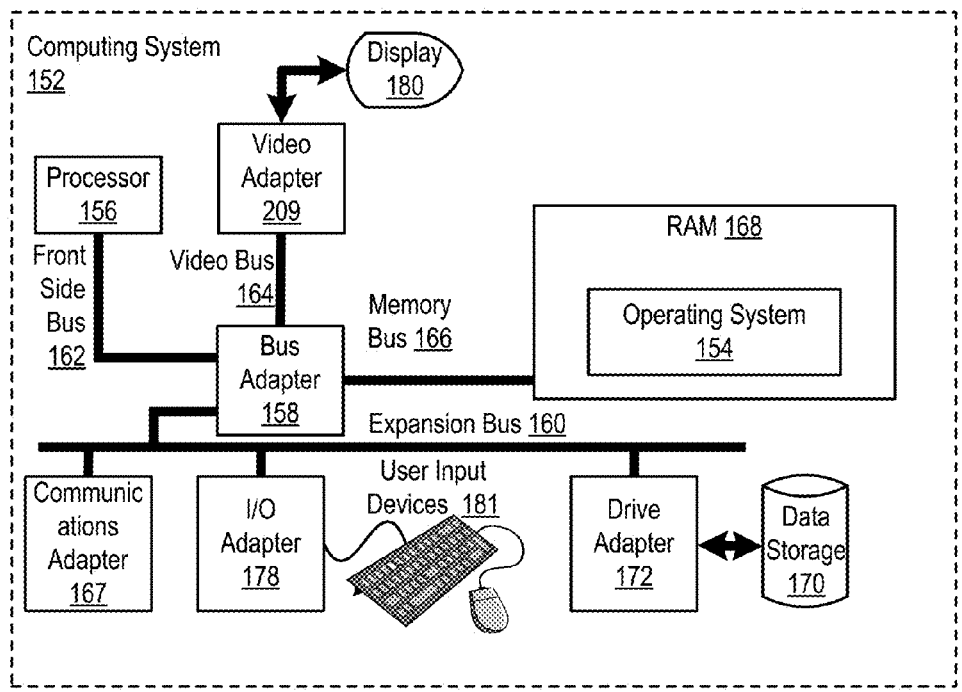
FIG. 1 sets forth a block diagram of an example system configured for generating a unique die identifier for an electronic chip according to embodiments of the present invention.

Exemplary methods, apparatus, and products for generating a unique die identifier for an electronic chip in accordance with the present invention are described with reference to the accompanying drawings, beginning with FIG. 1. FIG. 1 sets forth a block diagram of automated computing machinery comprising an exemplary computing system (152) configured for generating a unique die identifier for an electronic chip according to embodiments of the present invention. The computing system (152) of FIG. 1 includes at least one computer processor (156) or 'CPU' as well as random access memory (168) ('RAM') which is connected through a high speed memory bus (166) and bus adapter (158) to processor (156) and to other components of the computing system (152).

Stored in RAM (168) is an operating system (154). Operating systems useful in computers configured for generating a unique die identifier for an electronic chip according to embodiments of the present invention include UNIX™, Linux™, Microsoft XP™, AIX™, IBM's i OS™, and others as will occur to those of skill in the art. The operating system (154) in the example of FIG. 1 is shown in RAM (168), but many components of such software typically are stored in non-volatile memory also, such as, for example, on a disk drive (170).

The computing system (152) of FIG. 1 includes disk drive adapter (172) coupled through expansion bus (160) and bus adapter (158) to processor (156) and other components of the computing system (152). Disk drive adapter (172) connects non-volatile data storage to the computing system (152) in the form of data storage (170). Disk drive adapters useful in computers configured for generating a unique die identifier for an electronic chip according to embodiments of the present invention include Integrated Drive Electronics ('IDE') adapters, Small Computer System Interface ('SCSI') adapters, and others as will occur to those of skill in the art. Non-volatile computer memory also may be implemented for as an optical disk drive, electrically erasable programmable read-only memory (so-called 'EEPROM' or 'Flash' memory), RAM drives, and so on, as will occur to those of skill in the art.

The example computing system (152) of FIG. 1 includes one or more input/output ('I/O') adapters (178). I/O adapters implement user-oriented input/output through, for example, software drivers and computer hardware for controlling output to display devices such as computer display screens, as well as user input from user input devices (181) such as keyboards and mice. The example computing system (152) of FIG. 1 includes a video adapter (209), which is an example of an I/O adapter specially designed for graphic output to a display device (180) such as a display screen or computer monitor. Video adapter (209) is connected to processor (156) through a high speed video bus (164), bus adapter (158), and the front side bus (162), which is also a high speed bus.

The exemplary computing system (152) of FIG. 1 includes a communications adapter (167) for data communications with other computers and for data communications with a data communications network. Such data communications may be carried out serially through RS-232 connections, through external buses such as a Universal Serial Bus ('USB'), through data communications networks such as IP data communications networks, and in other ways as will occur to those of skill in the art. Communications adapters implement the hardware level of data communications through which one computer sends data communications to another computer, directly or through a data communications network. Examples of communications adapters useful in computers configured for generating a unique die identifier for an electronic chip according to embodiments of the present invention include modems for wired dial-up communications, Ethernet (IEEE 802.3) adapters for wired data communications, and 802.11 adapters for wireless data communications.

Figure 2:
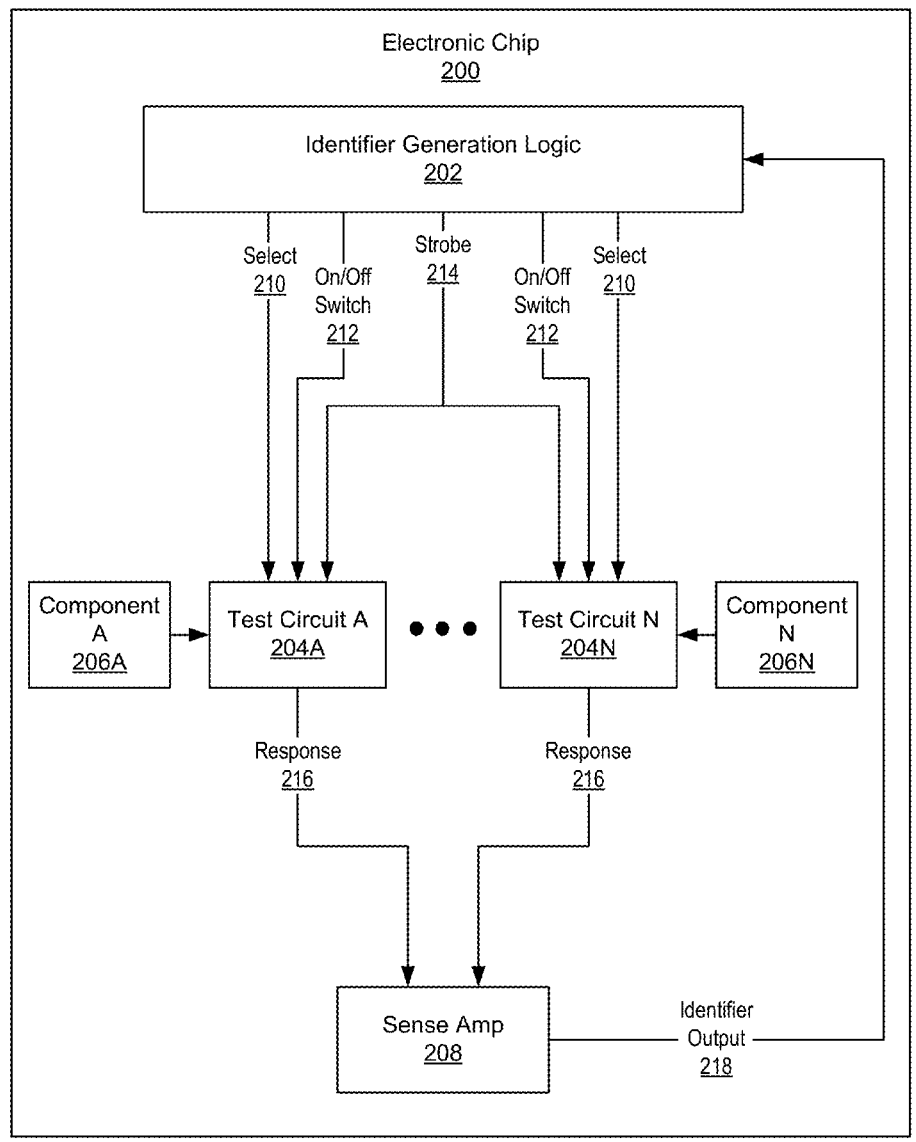
FIG. 2 sets forth an electronic chip configured for generating a unique die identifier for an electronic chip according to embodiments of the present invention.

FIG. 2 shows an electronic chip configured for generating a unique die identifier for an electronic chip in accordance with the present invention. As shown in FIG. 2, the electronic chip (200) includes identifier generation logic (202), a collection of test circuits (test circuit A (204A), test circuit N (204N)) operatively coupled to components (component A (206A), component N (206N)) of the electronic chip (200), and a sense amp (208). The electronic chip (200) also includes a number of signal lines (select (210), on/off switch (212), strobe (214), response (216), identifier output (218)).

The electronic chip (200) is a semiconducting die upon which an integrated circuit has been fabricated. The electronic chip (200) includes a number of electronic components, such as components (component A (206A), component N (206N)), that work together to perform a task, such as computer processing. Examples of components (component A (206A), component N (206N)) include transistors, capacitors, resistors, switches, etc.

The identifier generation logic (202) is logic within the electronic chip (200) that carries out generating a unique die identifier for an electronic chip. The identifier generation logic (202) includes, or has access to, an ordered list of race pairs of test circuits, such as test circuit A (204A) and test circuit N (204N). The ordered list of race pairs of test circuits is a programmed sequence of pairs of test circuits that are raced against one another. For example, the order list of race pairs of test circuits may be a list such as: 1. Test Circuit A vs. Test Circuit C; 2. Test Circuit A vs. Test Circuit D; 3. Test Circuit B vs. Test Circuit C; 4. Test Circuit B vs. Test Circuit D. The order list of race pairs of test circuits may include many more race pairs, and in order to ensure uniqueness of the resulting unique die identifier, may include over 25 race pairs using, for example, 10 test circuits.

Each test circuit (test circuit A (204A), test circuit N (204N)) is an integrated circuit within the electronic chip and attached to at least one component (component A (206A), component N (206N)) of the electronic chip (200). Each test circuit (test circuit A (204A), test circuit N (204N)) uses the attached component (component A (206A), component N (206N)) in generating the response signal (216) after receiving the strobe signal (214). Each component (component A (206A), component N (206N)) is a functional element of the primary operation of the electronic chip during the operational state. The test circuits (test circuit A (204A), test circuit N (204N)) may be attached to a subset of the components on the electronic chip.

The sense amp (208) is a component or circuit that detects the response signal (216) from two or more test circuits (test circuit A (204A), test circuit N (204N)) and generates the identifier output signal (218). The sense amp (208) may receive two or more response signals (216) (e.g., a positive response signal and a negative response signal), and generate an output, such as a bit, based on the order the response signals (216) are received. For example, the sense amp may output a '1' if the response signal (216) from test circuit A (204A) is received before the response signal (216) from test circuit N (204N) is received. The identifier output (218) may send the identifier output signals to the identifier generation logic (202). Alternatively, the identifier output (218) may send the identifier output signals to a memory location elsewhere on the electronic chip (202), or transmit the identifier output signals to a location off the electronic chip (202).

The signal lines (select (210), on/off switch (212), strobe (214), response (216), identifier output (218)) carry signals and/or power from one element on the electronic chip (200) to another. The select signal (210) activates the test circuits (test circuit A (204A), test circuit N (204N)) for the race and deselects the test circuits not participating in the current race. The on/off switch signal (212) activates or deactivates the components (component A (206A), component N (206N)) or elements within the test circuit (test circuit A (204A), test circuit N (204N)). The strobe signal (214) is sent to each test circuit (test circuit A (204A), test circuit N (204N)) to commence the race. In response to receiving the strobe signal (214), the selected test circuits generate a response signal (216). The identifier output (218) is generated by the sense amp (208) based on the outcome of the race between the test circuit response signals (216).

Figure 3:
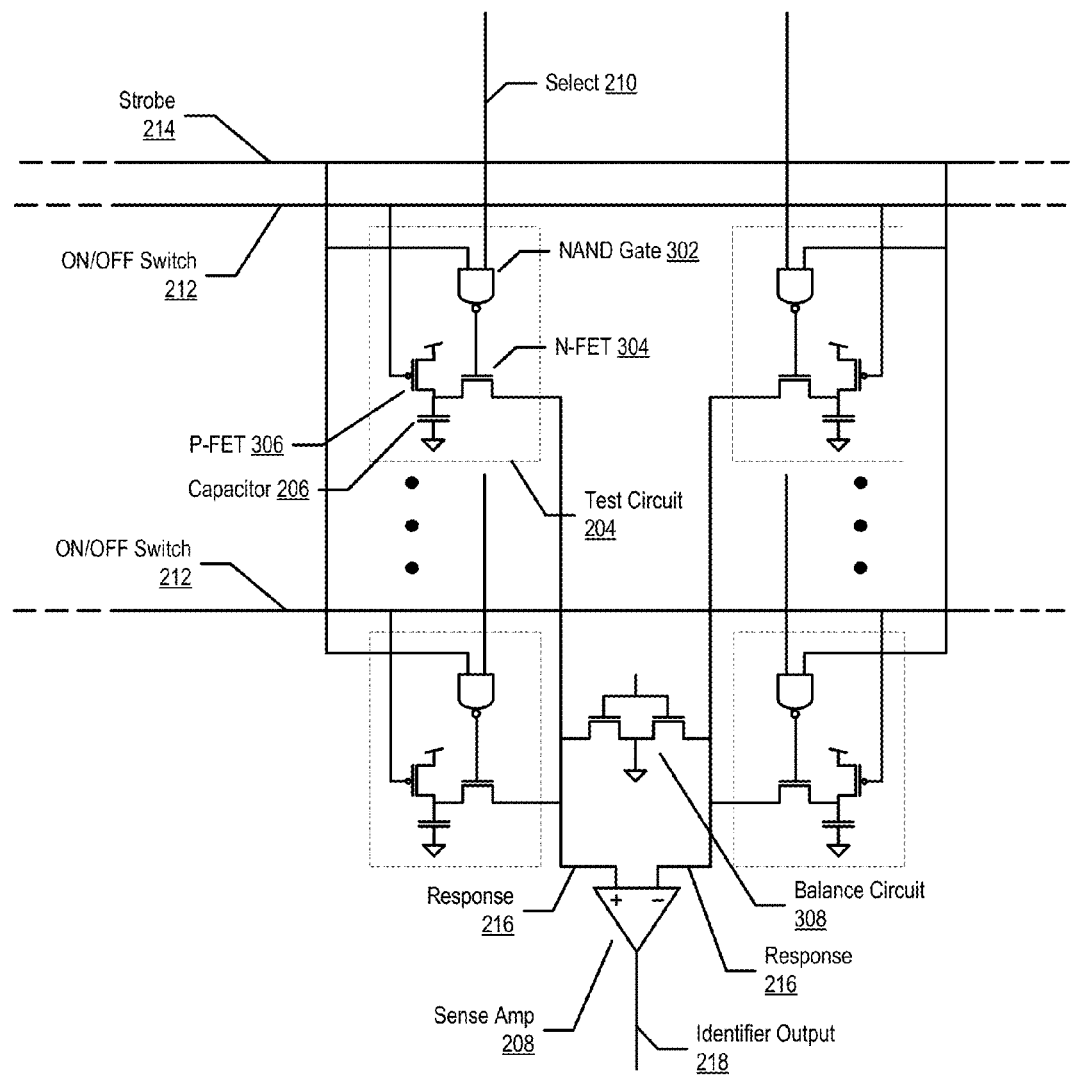
FIG. 3 sets forth an example schematic diagram for generating a unique die identifier for an electronic chip according to embodiments of the present invention.

FIG. 3 shows an example schematic diagram for generating a unique die identifier for an electronic chip in accordance with the present invention. As shown in FIG. 3, the example schematic includes four test circuits (204), signal lines (select (210), on/off switch (212), strobe (214), response (216), identifier output (218)), and the sense amp (208). The example schematic diagram in FIG. 3 also includes a balance circuit (308). The test circuit (204) shown in FIG. 3 includes a NAND gate (302), a negative channel field effect transistor (N-FET) (304), a positive channel field effect transistor (P-FET) (306), and a capacitor (206), which is a component of the electronic chip (200).

To begin each race, the on/off switch signal (212) is set to high in order to charge the capacitor (206), and the strobe signal (214) is set to low. Next the response signal (216) lines are balanced by the balance circuit (308) in order to ensure that the response signal (216) lines are free from interference or other signals that could affect the results of the race. Next the on/off switch signal (212) is set to low, and one test circuit (204) along each response signal (216) line is selected using the select signal (210) (i.e., one test circuit on either side of the sense amp (208) input).

The identifier generation logic then sets the strobe signal (214) to high. The strobe signal (214) is received by each test circuit, but only the selected test circuits will activate upon receiving the strobe signal (214). Specifically, the select signal (210) and the strobe signal (214) produce a low signal input to the N-FET (304) gate, allowing a response signal to be produced from the capacitor (206), through the N-FET (304) to the response signal (216) line.

The sense amp (208) detects which response signal (216) is received first. The difference in the amount of time it takes each test circuit to generate a response signal on the response signal (216) line may be affected by the relative strength of the N-FET (304) of each test circuit. Specifically, between two test circuits, the test circuit with the stronger N-FET (304) may generate the response signal on the response signal (216) line in less time than the test circuit with the weaker N-FET (304). Because no two electronic chips will have the same outcomes for the same set of race pairs, each electronic chip will generate a unique die identifier.

If the sense amp (208) receives the response signal (216) from the positive side first, the sense amp (208) will send a high or '1' signal on the identifier output (218) line. If the sense amp (208) receives the response signal (216) from the negative side first, the sense amp (208) will send a low or '0' signal on the identifier output (218) line.

Once the identifier output signal has been sent on the identifier output (218) line, another race pair is selected and the process is repeated. Each identifier output signal received on the identifier output (218) line is collected, in order, as the unique die identifier for an electronic chip. After all races in the ordered list of race pairs have been executed, the electronic chip is returned to an operational state by setting the on/off switch signal (212) to high (i.e. '1') in order to precharge the capacitors, and setting the strobe signal (214) to low (i.e. '0').

Figure 4:
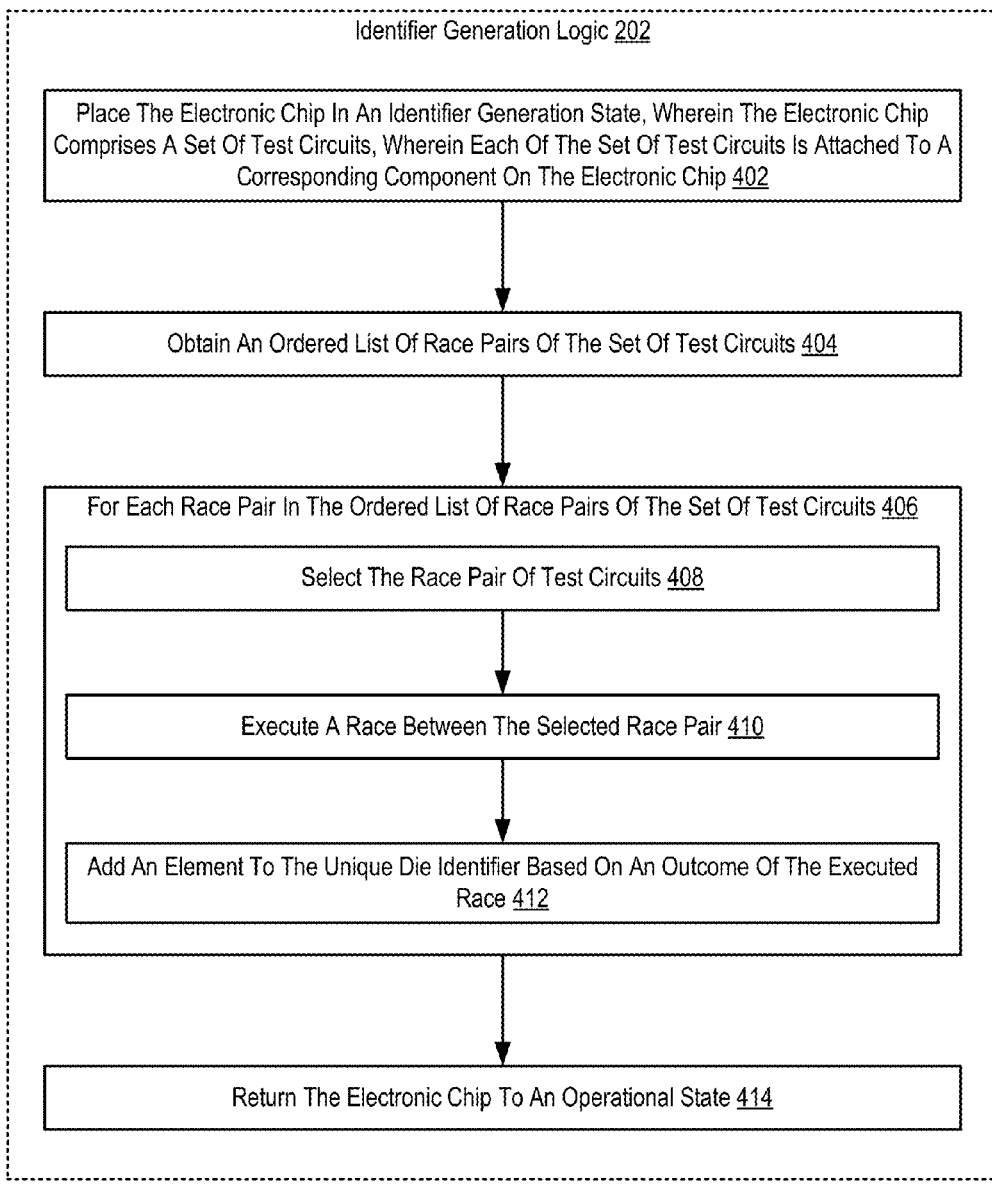
FIG. 4 sets forth a flow chart illustrating an exemplary method for generating a unique die identifier for an electronic chip according to embodiments of the present invention.

For further explanation, FIG. 4 sets forth a flow chart illustrating an exemplary method for generating a unique die identifier for an electronic chip according to embodiments of the present invention. The method of FIG. 4 includes placing (402) the electronic chip in an identifier generation state, wherein the electronic chip comprises a set of test circuits, wherein each of the set of test circuits is attached to a corresponding component on the electronic chip. Placing (402) the electronic chip in an identifier generation state, wherein the electronic chip comprises a set of test circuits, wherein each of the set of test circuits is attached to a corresponding component on the electronic chip may be carried out by placing a portion of the electronic chip in a dormant state.

The electronic chip may have at least two states, an operational state and an identifier generation state. The operational state may be, for example, operating as a processing unit for a computing system. The corresponding components on the electronic chip are duel-purpose components in that the components are functional during the operational state of the electronic chip in addition to performing a function in the test circuits for generating the unique die identifier during the identifier generation state. For example, the components may be a capacitor that acts as a decoupling capacitor during the primary operation of the electronic chip, in addition to functioning in the test circuits.

The method of FIG. 4 also includes obtaining (404) an ordered list of race pairs of the set of test circuits. Obtaining (404) an ordered list of race pairs of the set of test circuits may be carried out by accessing a portion of memory storage on the electronic chip. The ordered list of race pairs is an order of races executed between different pairs of test circuits. The order of race pairs is executed in order each time the unique die identifier is generated, and therefore produces the same unique die identifier.

The method of FIG. 4 also includes for each race pair (406) in the ordered list of race pairs of the set of test circuits: selecting (408) the race pair of test circuits. Selecting (408) the race pair of test circuits may be carried out by sending a selection signal to each of the test circuits of the race pair, wherein the selection signal enables the test circuits to receive a strobe signal.

The method of FIG. 4 also includes executing (410) a race between the selected race pair. Executing (410) a race between the selected race pair may be carried out by transmitting a strobe signal simultaneously to each test circuit; and receiving, in response to the strobe signal, a response signal from each test circuit.

The method of FIG. 4 also includes adding (412) an element to the unique die identifier based on an outcome of the executed race. Adding (412) an element to the unique die identifier based on an outcome of the executed race may be carried out by a sense amp determining the outcome of the race, and based on the outcome, transmitting an identifier output signal to the identifier generation logic and/or a memory location on the electronic chip.

Once each race in the ordered list of race pairs is executed, and each of the identifier output signals compiled, the unique die identifier is complete. The unique die identifier may be stored temporarily on memory within the electronic chip. The unique die identifier may be encrypted and transmitted to other elements on the computing system or to an external computing system requesting the unique die identifier.

The method of FIG. 4 also includes returning (414) the electronic chip to an operational state. Returning (414) the electronic chip to an operational state may include resuming the primary operation of the electronic chip. For example, if the components attached to the test circuits are capacitors, returning (414) the electronic chip to an operational state may be carried out by enabling each capacitor as a decoupling capacitor on the electronic chip.

For example, assume that a computer processor includes four test circuits (A, B, C, and D) each attached to a different decoupling capacitor of the processor. Further, assume that test circuits A and B are operatively coupled to a response signal line attached to a first (positive) input of the sense amp, and that test circuits C and D are operatively coupled to a response signal line attached to a second (negative) input of the sense amp.

The identifier generation logic (202) may receive a request for the unique die identifier of the processor. The identifier generation logic may determine that no unique die identifier is currently stored on the processor (perhaps because this is the first time the unique die identifier has been requested). The identifier generation logic places the processor in an identifier generation state making the portion of the processor not involved in the unique die identifier quiescent.

The identifier generation logic then obtains the ordered list of race pairs of test circuits. Assume that the ordered list of race pairs is as follows: 1. A vs. C; 2. A vs. D, 3. B vs. C; 4. B vs. D. For the first race, test circuits A and C are selected and the test is executed. Assume that the sense amp receives the response signal from C first, and because C is on the second (negative) input of the sense amp, the sense amp sends a '0' along the output identifier signal line.

For the second race, test circuits A and D are selected and the test is executed. Assume that the sense amp receives the response signal from A first, and because A is on the first (positive) input of the sense amp, the sense amp sends a '1' along the output identifier signal line. The unique die identifier is now '01'. For the third race, test circuits B and C are selected and the test is executed. Assume that the sense amp receives the response signal from C first, and because C is on the second (negative) input of the sense amp, the sense amp sends a '0' along the output identifier signal line. The unique die identifier is now '010'. Finally, for the fourth race, test circuits B and D are selected and the test is executed. Assume that the sense amp receives the response signal from B first, and because B is on the first (positive) input of the sense amp, the sense amp sends a '1' along the output identifier signal line. The complete unique die identifier is '0101'.

Once all races are executed, the complete unique identifier is stored on the processor and encrypted before being transmitted off the processor to the requesting entity. The processor is then placed in an operation state and resumes processing functions.

Figure 5:
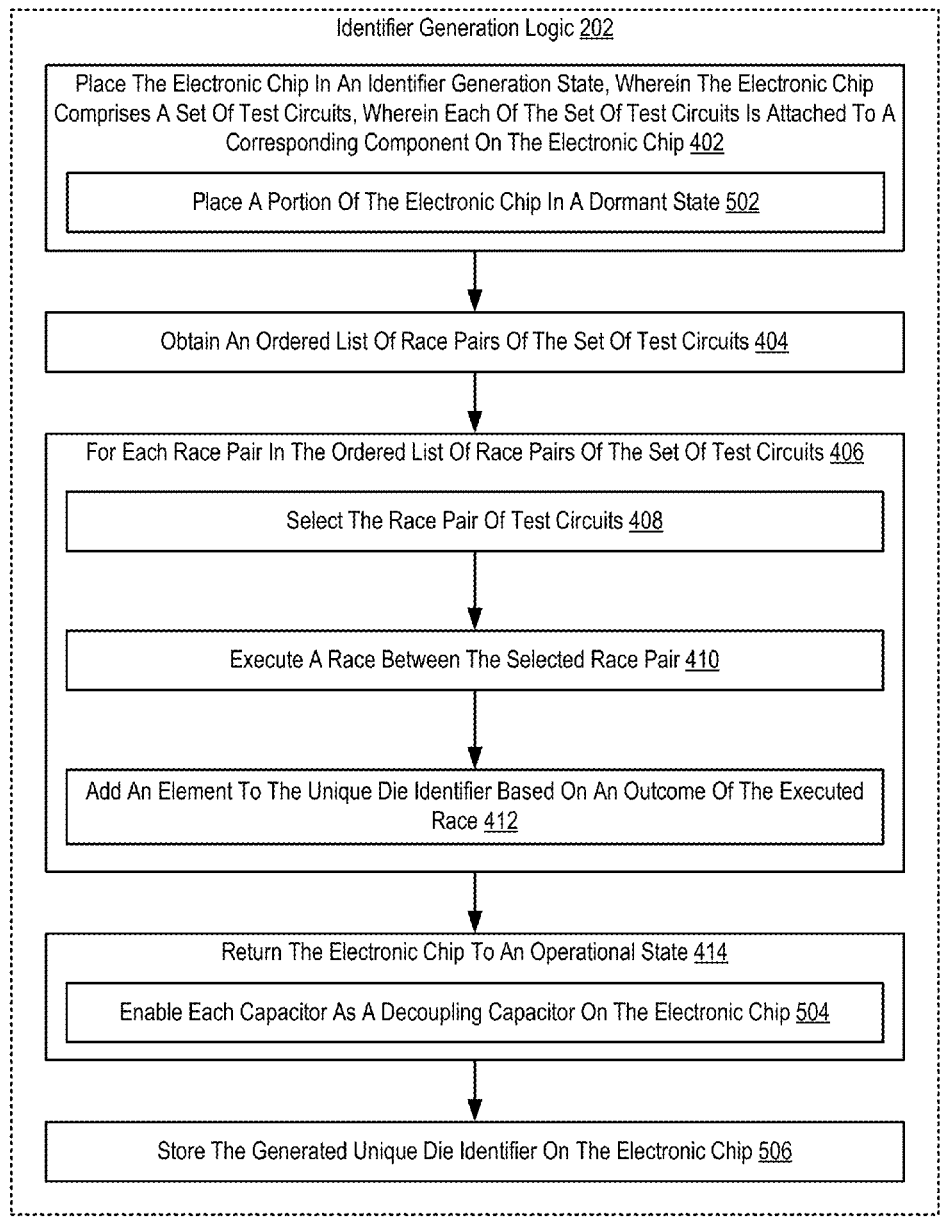
FIG. 5 sets forth a flow chart illustrating an exemplary method for generating a unique die identifier for an electronic chip according to embodiments of the present invention.

For further explanation, FIG. 5 sets forth a flow chart illustrating a further exemplary method for generating a unique die identifier for an electronic chip according to embodiments of the present invention that includes placing (402) the electronic chip in an identifier generation state, wherein the electronic chip comprises a set of test circuits, wherein each of the set of test circuits is attached to a corresponding component on the electronic chip; obtaining (404) an ordered list of race pairs of the set of test circuits; for each race pair (406) in the ordered list of race pairs of the set of test circuits: selecting (408) the race pair of test circuits; executing (410) a race between the selected race pair; and adding (412) an element to the unique die identifier based on an outcome of the executed race; and returning (414) the electronic chip to an operational state.

The method of FIG. 5 differs from the method of FIG. 4, however, in that placing (402) the electronic chip in an identifier generation state, wherein the electronic chip comprises a set of test circuits, wherein each of the set of test circuits is attached to a corresponding component on the electronic chip includes placing (502) a portion of the electronic chip in a dormant state. Placing (502) a portion of the electronic chip in a dormant state may be carried out by powering down or turning off components of the electronic chip that are not attached to the test circuits and are not involved in the unique die identifier generation. Placing (502) a portion of the electronic chip in a dormant state may prevent power supply or signal noise from influencing the outcomes of the test circuit races.

The method of FIG. 5 also differs from the method of FIG. 4, however, in that returning (414) the electronic chip to an operational state includes enabling (504) each capacitor as a decoupling capacitor on the electronic chip. Enabling (504) each capacitor as a decoupling capacitor on the electronic chip may be carried out by setting the on/off signal to a 1 and setting strobe signal to a 0, activating the functional operation of the electronic chip, and utilizing the capacitors as decoupling capacitors to decouple one part of the circuit from another.

The method of FIG. 5 also differs from the method of FIG. 4, however, in that FIG. 5 further includes storing (506) the generated unique die identifier on the electronic chip. Storing (506) the generated unique die identifier on the electronic chip may be carried out by encrypting the unique die identifier in a manner that may be decrypted by an authorized recipient of the unique die identifier. The unique die identifier may be stored temporarily in order to perform the encryption, or may be stored for a longer period of time.

For example, the electronic chip may receive requests for the unique die identifier frequently during a certain period of time. Once the unique die identifier is initially generated and provided in response to the first request, the electronic chip may store the unique die identifier. The stored unique die identifier may then be provided in response to subsequent requests instead of generating the unique die identifier in response to each individual request. The electronic chip may keep the unique die identifier in memory according to a policy (e.g., no requests for 24 hours triggers removal).

Figure 6:
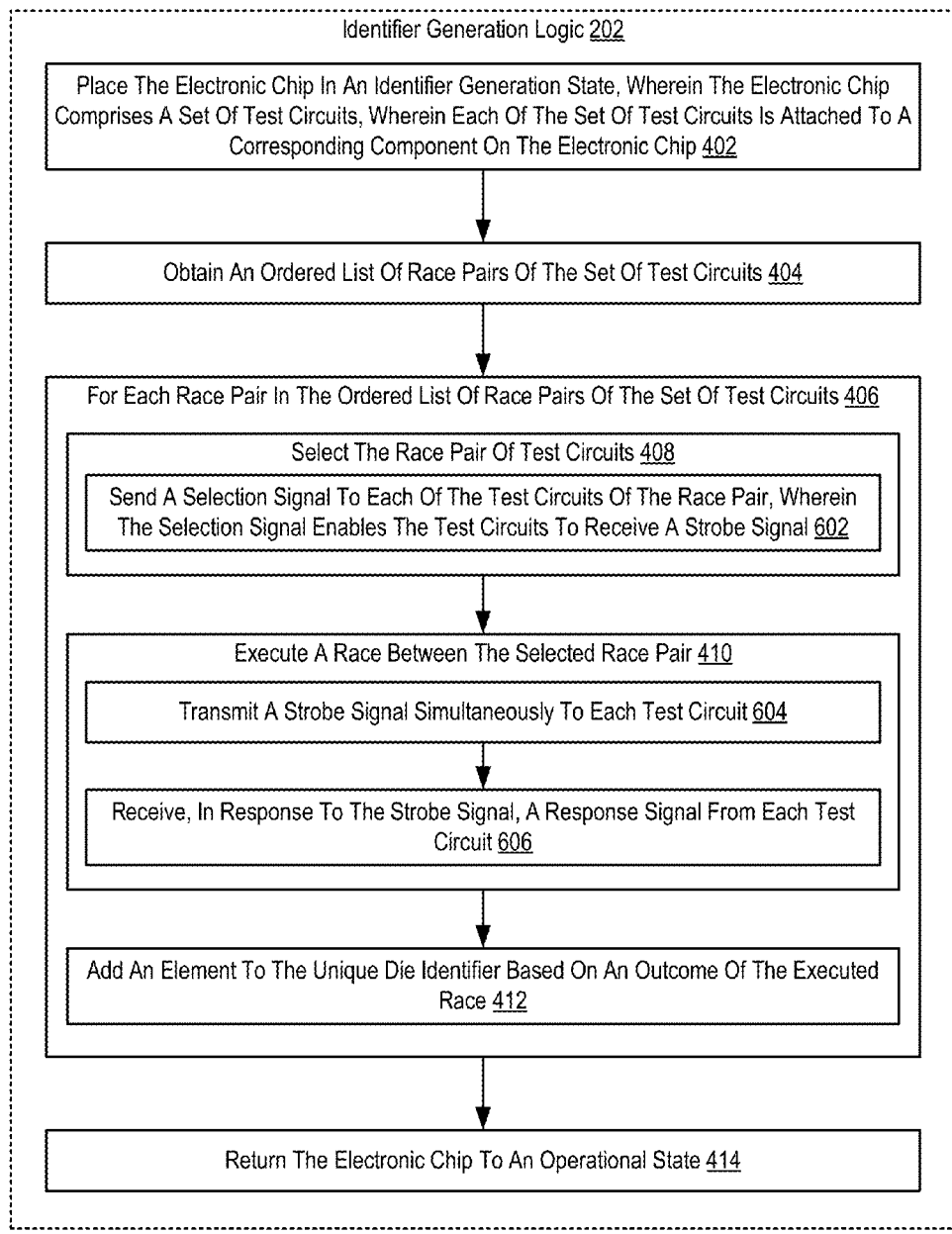
FIG. 6 sets forth a flow chart illustrating an exemplary method for generating a unique die identifier for an electronic chip according to embodiments of the present invention.

For further explanation, FIG. 6 sets forth a flow chart illustrating a further exemplary method for generating a unique die identifier for an electronic chip according to embodiments of the present invention that includes placing (402) the electronic chip in an identifier generation state, wherein the electronic chip comprises a set of test circuits, wherein each of the set of test circuits is attached to a corresponding component on the electronic chip; obtaining (404) an ordered list of race pairs of the set of test circuits; for each race pair (406) in the ordered list of race pairs of the set of test circuits: selecting (408) the race pair of test circuits; executing (410) a race between the selected race pair; and adding (412) an element to the unique die identifier based on an outcome of the executed race; and returning (414) the electronic chip to an operational state.

The method of FIG. 6 differs from the method of FIG. 4, however, in that selecting (408) the race pair of test circuits includes sending (602) a selection signal to each of the test circuits of the race pair, wherein the selection signal enables the test circuits to receive a strobe signal. Sending (602) a selection signal to each of the test circuits of the race pair, wherein the selection signal enables the test circuits to receive a strobe signal may be carried out by targeting each test circuit of the race pair with the selection signal. The selection signal may be transmitted to one input of a NAND gate, such that the strobe signal sent to the other input produces a desired output on only the selected test circuits.

The method of FIG. 6 also differs from the method of FIG. 4, however, in that executing (410) a race between the selected race pair includes transmitting (604) a strobe signal simultaneously to each test circuit; and receiving (606), in response to the strobe signal, a response signal from each test circuit. Transmitting (604) a strobe signal simultaneously to each test circuit may be carried out by sending the strobe signal on a signal line that is operatively coupled to each test circuit. The strobe signal may be transmitted to one input of a NAND gate, such that the selection signal sent to the other input produces a desired output on only the selected test circuits.

Receiving (606), in response to the strobe signal, a response signal from each test circuit may be carried out by the output of the NAND gate activating an N-FET causing a response signal to be generated at the test circuit and sent from the test circuit to a sense amp.

In view of the explanations set forth above, readers will recognize that the benefits of generating a unique die identifier for an electronic chip according to embodiments of the present invention include:
  Improving the operation of electronic chips by integrating logic that generates a different identifier for identically manufactured electronic chips, increasing the functionality of electronic chips.
  Improving the operation of electronic chips by integrating logic that generates a different identifier for identically manufactured electronic chips, increasing the efficacy of electronic chip manufacturing.

Exemplary embodiments of the present invention are described largely in the context of a fully functional computer system for generating a unique die identifier for an electronic chip. Readers of skill in the art will recognize, however, that the present invention also may be embodied in a computer program product disposed upon computer readable storage media for use with any suitable data processing system. Such computer readable storage media may be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the invention as embodied in a computer program product. Persons skilled in the art will recognize also that, although some of the exemplary embodiments described in this specification are oriented to software installed and executing on computer hardware, nevertheless, alternative embodiments implemented as firmware or as hardware are well within the scope of the present invention.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method of generating a unique die identifier for an electronic chip, the method comprising:
    placing the electronic chip in an identifier generation state, wherein the electronic chip comprises a set of test circuits, and wherein each of the set of test circuits is attached to a corresponding component on the electronic chip;
    obtaining an ordered list of race pairs of the set of test circuits, wherein the ordered list of the race pairs of the set of test circuits is a programmed sequence of pairs of test circuits that are raced against one another;
    for each race pair in the ordered list of race pairs of the set of test circuits:
        selecting the race pair of test circuits;
        executing a race between the selected race pair; and
        adding an element to a unique die identifier based on an outcome of the executed race; and
    returning the electronic chip to an operational state.

2. The method of claim 1, wherein each of the corresponding components on the electronic chip is a capacitor, and wherein returning the electronic chip to the operational state comprises:
    enabling each capacitor as a decoupling capacitor on the electronic chip.

3. The method of claim 1, further comprising:
    storing the generated unique die identifier on the electronic chip.

4. The method of claim 1, wherein executing the race between a race pair of the ordered list of race pairs comprises:
    transmitting a strobe signal simultaneously to each test circuit; and
    receiving, in response to the strobe signal, a response signal from each test circuit.

5. The method of claim 1, wherein the outcome of the executed race is determined based on a relative strength of corresponding field-effect transistors within the test circuits.

6. The method of claim 1, wherein placing the electronic chip in an identifier generation state comprises placing a portion of the electronic chip in a dormant state.

7. The method of claim 1, wherein selecting the race of the test circuits comprises:
    sending a selection signal to each of the test circuits of the race pair, wherein the selection signal enables the test circuits to receive a strobe signal.

8. An electronic chip that generates a unique die identifier, the electronic chip having disposed within it logic that causes the electronic chip to carry out steps of:
    placing the electronic chip in an identifier generation state, wherein the electronic chip comprises a set of test circuits, and wherein each of the set of test circuits is attached to a corresponding component on the electronic chip;
    obtaining an ordered list of race pairs of the set of test circuits, wherein the ordered list of race pairs is programmed sequence of pairs of test circuits that are raced against one another;
    for each race pair in the ordered list of race pairs of the set of test circuits:
        selecting the race pair of test circuits;
        executing a race between the selected race pair; and
        adding an element to a unique die identifier based on an outcome of the executed race; and
    returning the electronic chip to an operational state.

9. The electronic chip of claim 8, wherein each of the corresponding components on the electronic chip is a capacitor, and wherein returning the electronic chip to the operational state comprises:
    enabling each capacitor as a decoupling capacitor on the electronic chip.

10. The electronic chip of claim 8, the steps further comprising:
    storing the generated unique die identifier on the electronic chip.

11. The electronic chip of claim 8, wherein executing the race between a race pair of the ordered list of race pairs comprises:
    transmitting a strobe signal simultaneously to each test circuit; and
    receiving, in response to the strobe signal, a response signal from each test circuit.

12. The electronic chip of claim 8, wherein the outcome of the executed race is determined based on a relative strength of corresponding field-effect transistors within the test circuits.

13. The electronic chip of claim 8, wherein placing the electronic chip in an identifier generation state comprises placing a portion of the electronic chip in a dormant state.

14. The electronic chip of claim 8, wherein selecting the race of the test circuits comprises:
    sending a selection signal to each of the test circuits of the race pair, wherein the selection signal enables the test circuits to receive a strobe signal.

15. A computer program product for generating a unique die identifier for an electronic chip, the computer program product disposed upon the electronic chip, the computer program product comprising computer program instructions that, when executed, cause the electronic chip to carry out steps of:
    placing the electronic chip in an identifier generation state, wherein the electronic chip comprises a set of test circuits, and wherein each of the set of test circuits is attached to a corresponding component on the electronic chip;
    obtaining an ordered list of race pairs of the set of test circuits, wherein the ordered list of race pairs is a programmed sequence of pairs of test circuits that are raced against one another;
    for each race pair in the ordered list of race pairs of the set of test circuits:
        selecting the race pair of test circuits;
        executing a race between the selected race pair; and
        adding an element to a unique die identifier based on an outcome of the executed race; and
    returning the electronic chip to an operational state.

16. The computer program product of claim 15, wherein each of the corresponding components on the electronic chip is a capacitor, and wherein returning the electronic chip to the operational state comprises:
   enabling each capacitor as a decoupling capacitor on the electronic chip.

17. The computer program product of claim 15, the steps further comprising:
   storing the generated unique die identifier on the electronic chip.

18. The computer program product of claim 15, wherein executing the race between a race pair of the ordered list of race pairs comprises:
   transmitting a strobe signal simultaneously to each test circuit; and
   receiving, in response to the strobe signal, a response signal from each test circuit.

19. The computer program product of claim 15, wherein placing the electronic chip in an identifier generation state comprises placing a portion of the electronic chip in a dormant state.

20. The computer program product of claim 15, wherein selecting the race of the test circuits comprises:
   sending a selection signal to each of the test circuits of the race pair, wherein the selection signal enables the test circuits to receive a strobe signal.

* * * * *